United States Patent
Venezia et al.

(10) Patent No.: US 8,338,900 B2
(45) Date of Patent: Dec. 25, 2012

(54) IMAGE SENSOR HAVING CURVED MICRO-MIRRORS OVER THE SENSING PHOTODIODE AND METHOD FOR FABRICATING

(75) Inventors: Vincent Venezia, Los Gatos, CA (US); Hsin-Chih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/985,950

(22) Filed: Jan. 6, 2011

(65) Prior Publication Data
US 2011/0140221 A1    Jun. 16, 2011

Related U.S. Application Data

(62) Division of application No. 11/588,925, filed on Oct. 26, 2006, now Pat. No. 7,888,159.

(51) Int. Cl.
*H01L 31/113* (2006.01)
(52) U.S. Cl. .............. 257/432; 257/294; 257/E31.127
(58) Field of Classification Search .......... 257/290–294, 257/21, 432, E31.127
See application file for complete search history.

(56) References Cited

U.S. PATENT DOCUMENTS

| 5,122,669 | A | 6/1992 | Herring et al. |
| 6,498,336 | B1 | 12/2002 | Tian et al. |
| 7,265,402 | B2 * | 9/2007 | Koyanagi ............. 257/292 |
| 2005/0088753 | A1 | 4/2005 | Shimizu et al. |
| 2006/0057764 | A1 | 3/2006 | Pan et al. |
| 2006/0061674 | A1 | 3/2006 | Iida et al. |

FOREIGN PATENT DOCUMENTS
JP         04218965       8/1992
WO    WO 2006/080592 A1    8/2006

OTHER PUBLICATIONS

CN 200710163496.4—First Chinese Office Action, issued May 12, 2010, with English Translation (12 pages).
EP 07 118 824.7—European Search Report and Search Opinion, dated Feb. 6, 2008. (11 Pages).
EP 07 118 824.7—European Office Action dated Jul. 12, 2010 (7 pages).
CN 200710163496.4—Third Chinese Office Action, issued Mar. 12, 2012 with English Translation (9 pages).

* cited by examiner

*Primary Examiner* — Jack Chen
(74) *Attorney, Agent, or Firm* — Blakely Sokoloff Taylor & Zafman LLP

(57) ABSTRACT

The invention involves the integration of curved micro-mirrors over a photodiode active area (collection area) in a CMOS image sensor (CIS) process. The curved micro-mirrors reflect light that has passed through the collection area back into the photo diode. The curved micro-mirrors are best implemented in a backside illuminated device (BSI).

10 Claims, 24 Drawing Sheets

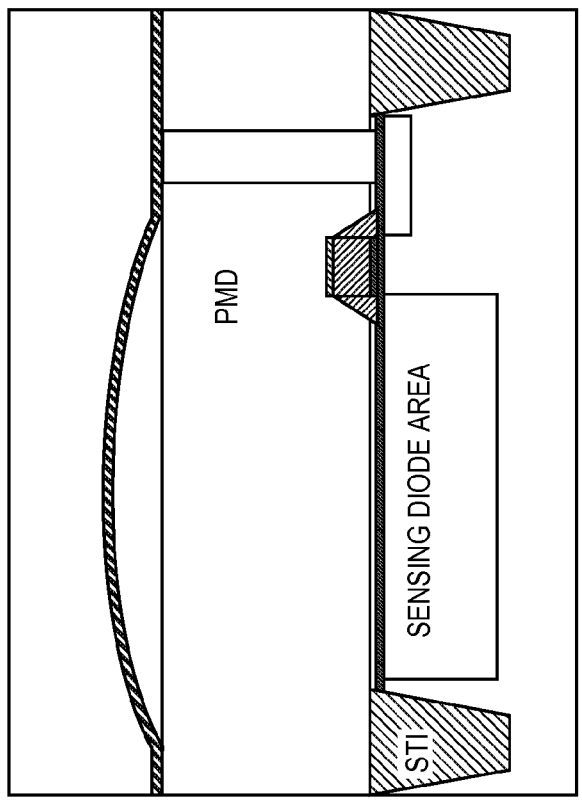
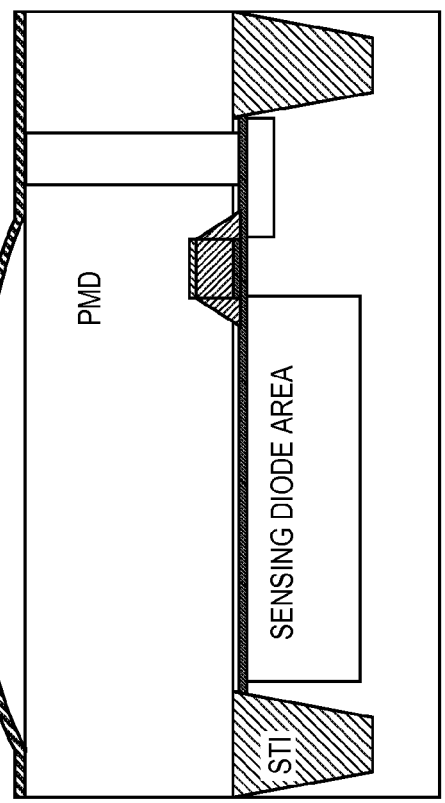
FIG. 6D
FIG. 6C

IMAGE SENSOR HAVING CURVED MICRO-MIRRORS OVER THE SENSING PHOTODIODE AND METHOD FOR FABRICATING

CROSS-REFERENCED TO RELATED APPLICATION

This application is a divisional of U.S. patent application Ser. No. 11/588,925, filed Oct. 26, 2006 now U.S. Pat. No. 7,888,159. U.S. patent application Ser. No. 11/588,925 is hereby incorporated by reference.

FIELD OF THE INVENTION

The present invention relates to image sensor devices, and more particularly, to image sensors with micro-mirrors formed over the light sensitive elements.

BACKGROUND

As the size of image sensors and the individual pixels that make up the sensing array become smaller as the result of further integration, it becomes important to capture as much of the incident light onto the sensing array as possible.

Approaches to addressing this issue include having the light sensitive element (such as a photodiode) take up as much as the pixel area as possible. Another approach is to use microlenses over each pixel to focus the incident light onto the photodiode. The microlens approach attempts to capture the light that would be normally incident on portions of the pixel outside of the photodiode region.

Further, in a backside illuminated (BSI) device, a flat mirror material may be used to reflect light back through the photodiode, thereby causing more of the incident light to be converted into an electrical signal.

SUMMARY

The invention involves the integration of curved mirrors over a photodiode active area (collection area) in a CMOS image sensor (CIS) process. The curved micro-mirrors reflect light that has passed through the collection area back into the photodiode. The curved micro-mirrors are in one embodiment implemented in a BSI device.

BRIEF DESCRIPTION OF THE DRAWINGS

FIGS. 6A-6G illustrate a process for manufacturing a backside illuminated device with a curved micro-mirror above a pre-metal dielectric layer, according to one embodiment of the invention.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

References throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
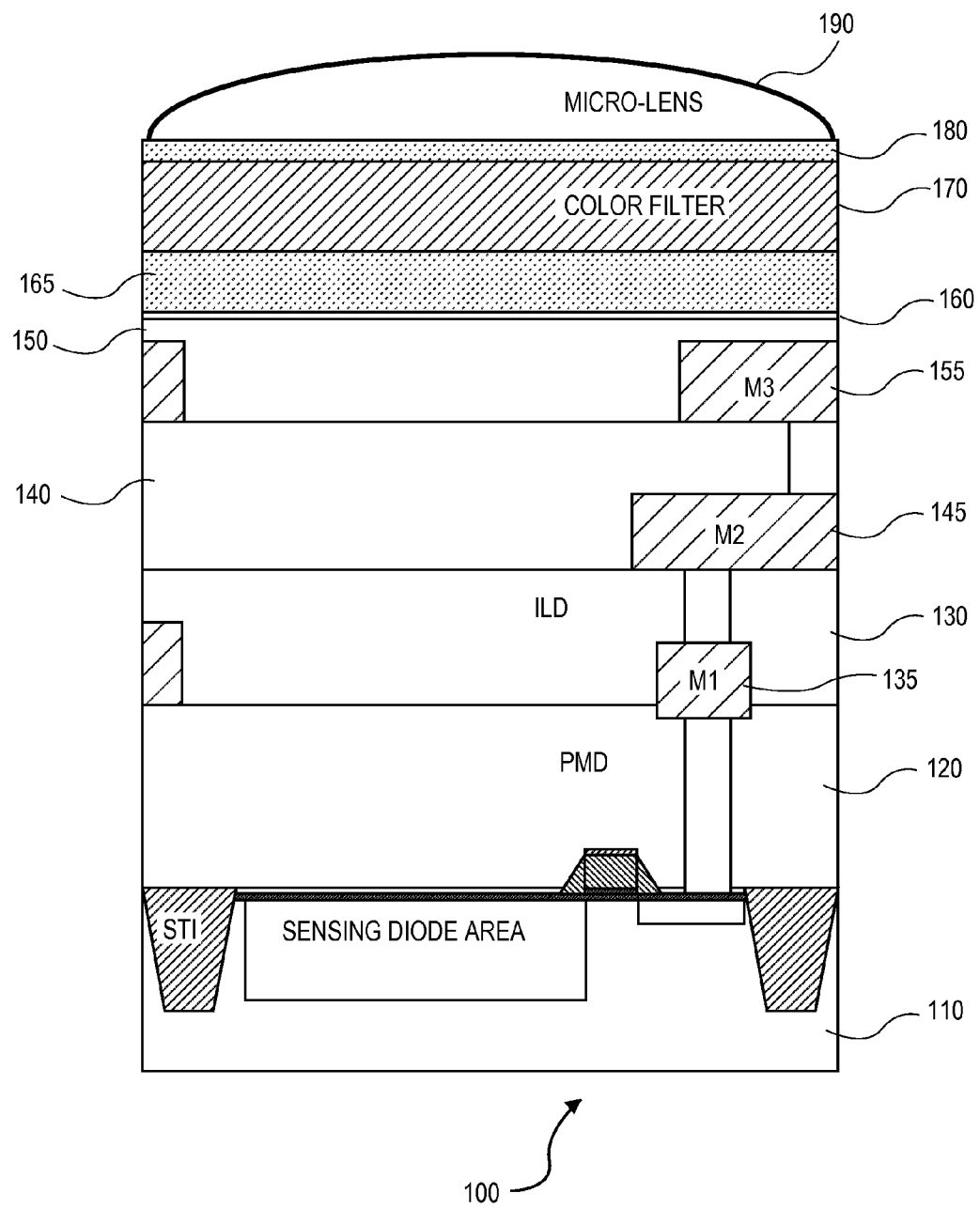
FIG. 1 illustrates a schematic cross-section portion of a prior art CMOS image sensor with micro-lens.

FIG. 1 illustrates a schematic cross-section portion of a prior art CMOS image sensor 100 with micro-lens 190. A substrate 110 has formed therein a photodiode and is coupled to pre-metal dielectric (PMD) layer 120. Pre-metal dielectric (PMD) layer 120 is coupled to inter-layer dielectric (ILD) layer 130 and first metal layer 135. Inter-layer dielectric (ILD) layer 130 is coupled to inter-layer dielectric (ILD) layer 140 and second metal layer 145. Inter-layer dielectric (ILD) layer 140 is coupled to inter-layer dielectric (ILD) layer 150 and third metal layer 155. Inter-layer dielectric layer 150 is coupled to and underneath antireflective layer 160. Antireflective layer 160 is coupled to and underneath planarization layer 165. Planarization layer 165 is coupled to color filter 170. Color filter 170 is coupled to planarization layer 180. Planarization layer 180 is coupled to microlens 190.

The prior art cross-section of an image sensor shown in FIG. 1 may include fewer or greater dielectric and/or metal layers. However, the general concepts are the same, i.e. that a photodiode is formed in a substrate and various dielectric and metal layers are formed atop of the substrate. Further, a color filter layer and microlenses are formed on top of the pixel to complete the main functional structures in the cross section view. FIG. 1 shows a conventional "front side" image sensor where the light is incident from the top surface of the substrate.

Figure 2:
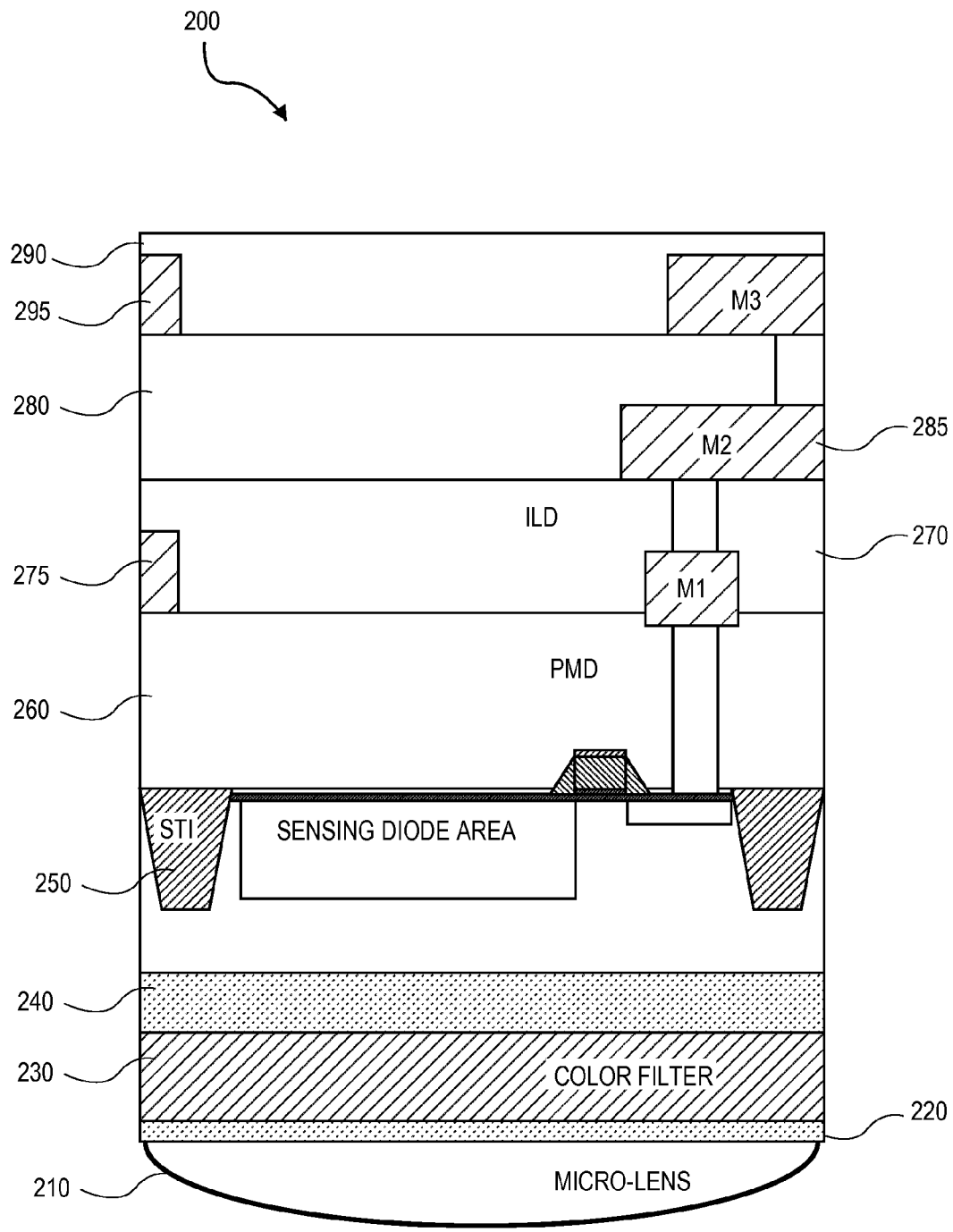
FIG. 2 illustrates a schematic cross-section portion of a prior art backside illuminated device with micro-lens.

FIG. 2 illustrates a schematic cross-section portion of a prior art backside illuminated device 200 with micro-lens 210. Micro-lens 210 is coupled to a planarization layer 220. Planarization layer 220 is coupled to a color filter 230. The color filter 230 is coupled to planarization layer 240. Finally, the planarization layer 240 is formed on the backside (or bottom surface) of the substrate 250 that contains the photodiode. On the top surface of the substrate 250, the substrate has the various dielectric and metal layers as shown in FIG. 1 that are used for electrical interconnection to other components of the pixel and/or sensing array. Thus, substrate 250 is coupled to pre-metal dielectric (PMD) layer 260. PMD layer 260 is coupled to inter-layer dielectric (ILD) layer 270 and first metal layer 275. ILD layer 270 is coupled to inter-layer dielectric (ILD) layer 280 and second metal layer 285. ILD layer 280 is coupled to inter-layer dielectric (ILD) layer 290 and third metal layer 295.

Figure 3:
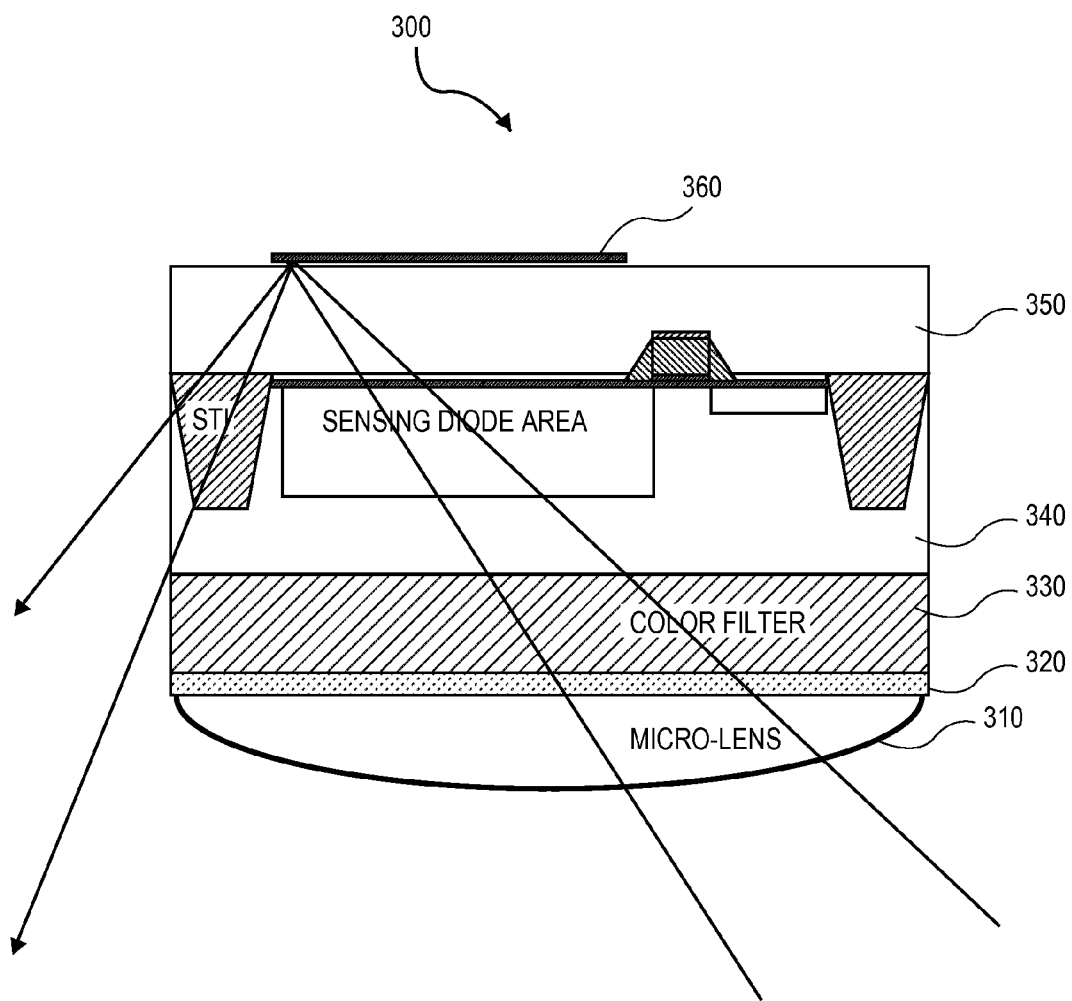
FIG. 3 illustrates a schematic cross-section portion of a backside illuminated device with light paths reflected from a prior art flat micro-mirror.

FIG. 3 illustrates a schematic cross-section portion of a prior art backside illuminated device 300 with light paths reflected from a flat micro-mirror 360. Micro-lens 310 is coupled to planarization layer 320. Planarization layer 320 is coupled to color filter 330. Color filter 330 is coupled to photodiode layer 340. Photodiode layer 340 is coupled to pre-metal dielectric (PMD) layer 350. PMD layer 350 is coupled to flat micro-mirror 360. Incident light is lost, or worse causes crosstalk with adjacent pixels.

Figure 4:
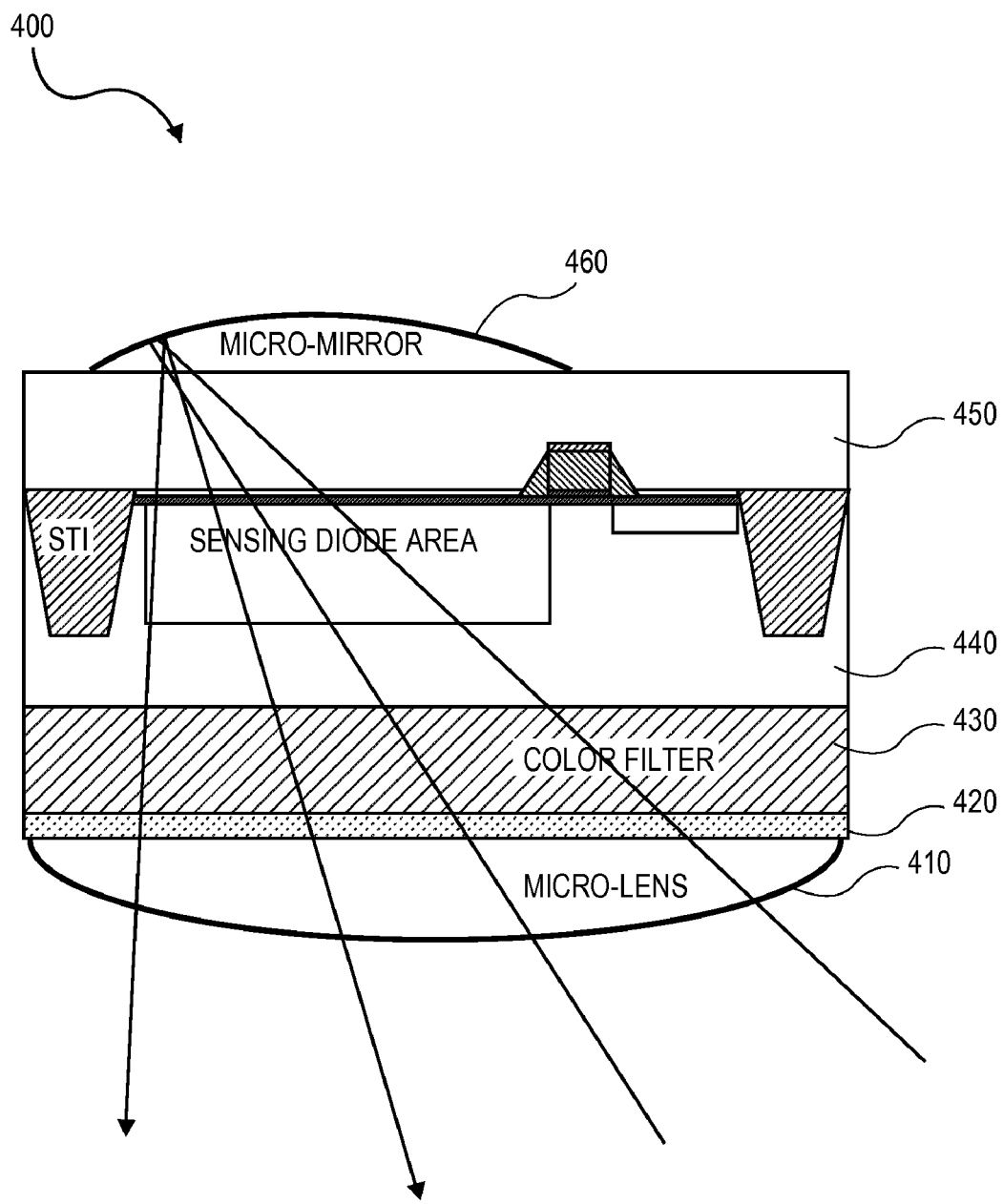
FIG. 4 illustrates a schematic cross-section portion of a backside illuminated device with light paths reflected from a curved micro-mirror, according to one embodiment of the invention.

FIG. 4 illustrates an advantage of the present invention. FIG. 4 shows a schematic cross-section portion of a backside illuminated device 400 with light paths reflected from a curved micro-mirror 460. As can be seen and in contrast to FIG. 3, a curved micro-mirror 460 is effective to capture and redirect a higher amount of "passthrough" incident light back through the photodiode area. This is advantageous for increasing the signal generated by the photodiode.

Figure 5:
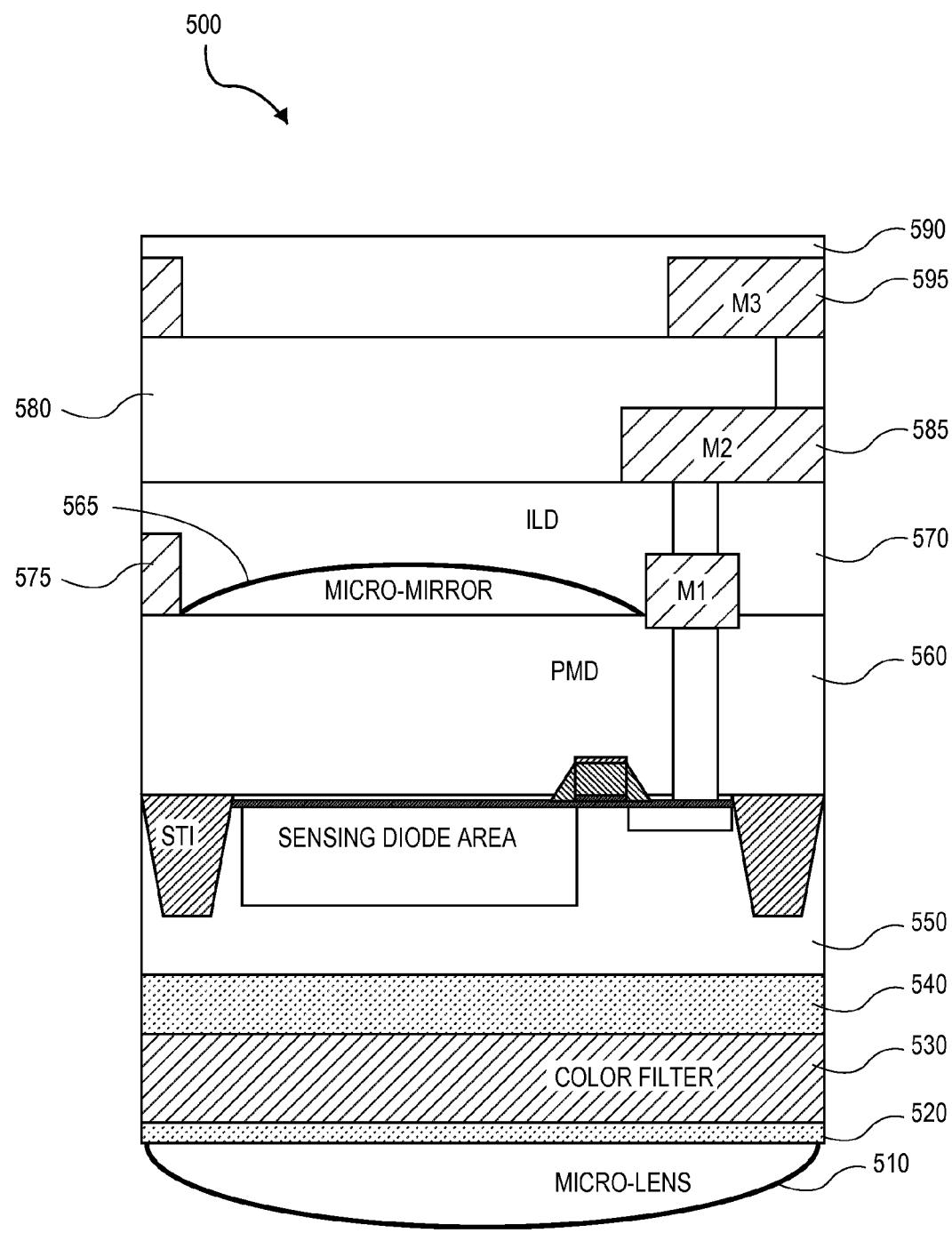
FIG. 5 illustrates a schematic cross-section portion of a backside illuminated device with a curved micro-mirror above a pre-metal dielectric layer, according to one embodiment of the invention.
Figure 6A:
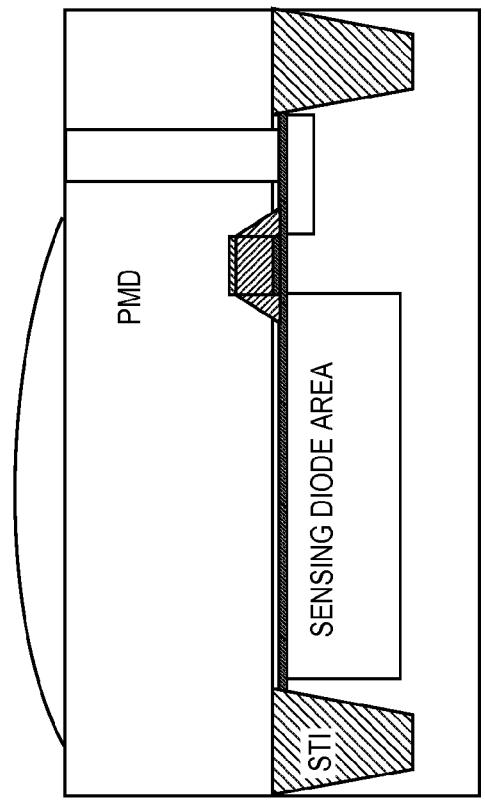
Figure 6B:
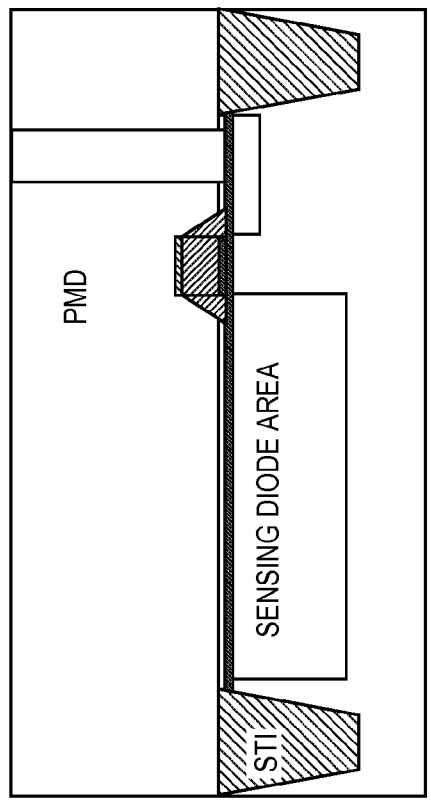
Figure 6F:
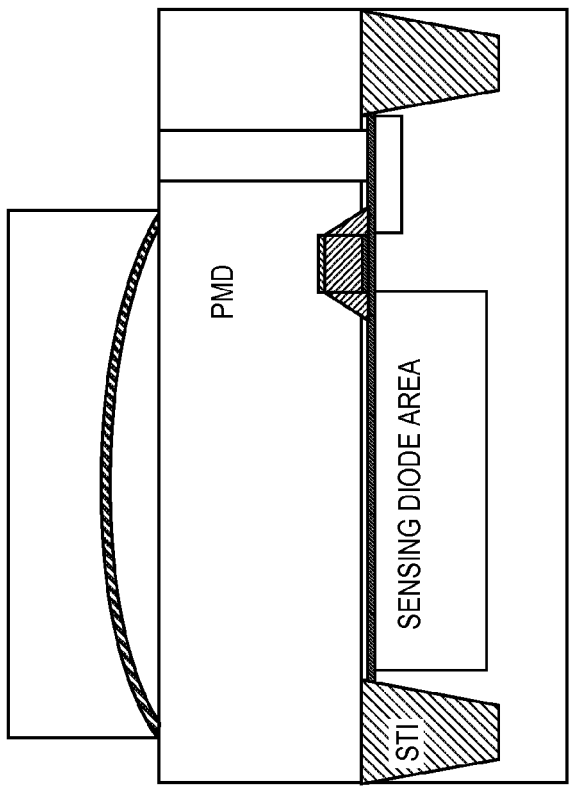
Figure 6E:
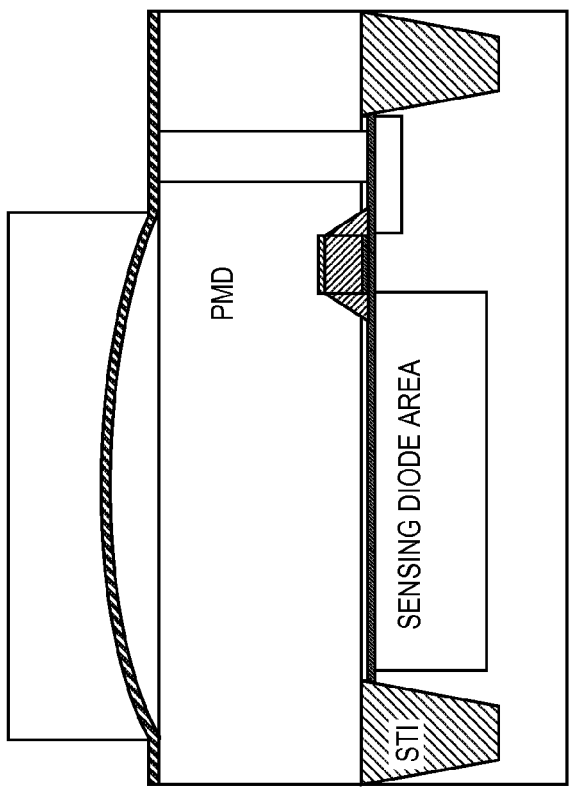
Figure 6G:
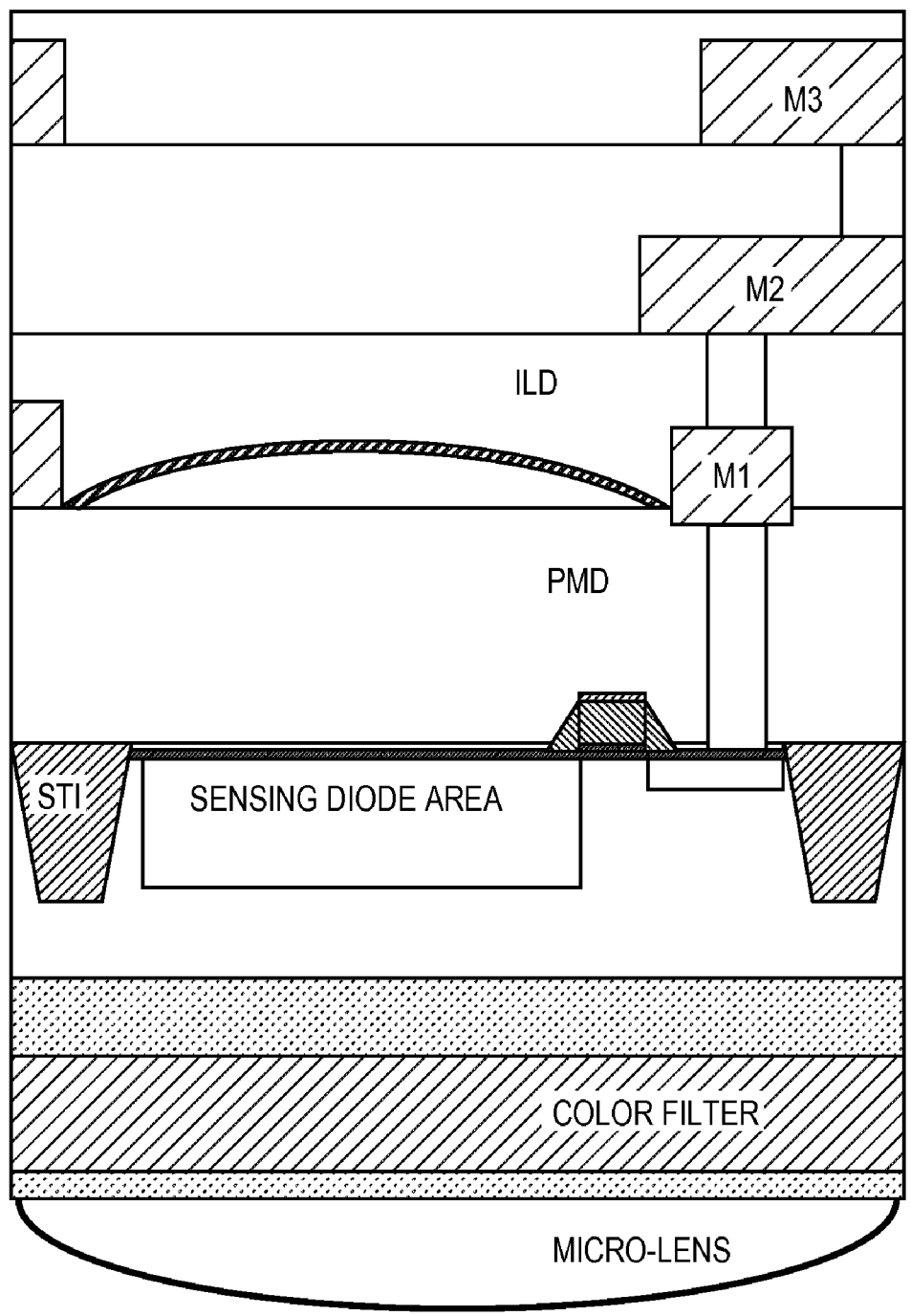

FIG. 5 illustrates a schematic cross-section portion of a backside illuminated device 500 with a curved micro-mirror 565 above a pre-metal dielectric layer 560 according to one embodiment of the present invention. As will be apparent from the following discussion, the micro-mirror 565 may be placed in a variety of locations in the "dielectric stack" encompassing layers 560-590. Indeed, the micro-mirror 565 may be placed between the substrate 550 and the pre-metal dielectric layer 560 or atop of the inter-layer dielectric layer 590. The precise placement is generally dependent upon various specific design parameters and dimensions of the image sensor, but is generally placed to maximize reflection of light onto the photodiode.

As seen in FIG. 5, on the backside of the substrate 550, micro-lens 510 is coupled to planarization layer 520. Planarization layer 520 is coupled to color filter 530. Color filter 530 is coupled to planarization layer 540. Finally, planarization layer 540 is coupled to substrate 550.

On the topside of the substrate 550, pre-metal dielectric (PMD) layer 560 is formed atop of the substrate 550. PMD layer 560 is coupled to curved micro-mirror 565. PMD layer 560 is also coupled to inter-layer dielectric (ILD) layer 570 and first metal layer 575. ILD layer 570 is coupled to inter-layer dielectric (ILD) layer 580 and second metal layer 585. ILD layer 580 is coupled to inter-layer dielectric (ILD) layer 590 and third metal layer 595.

In one embodiment of the invention, the CIS may be processed up to the first metal layer, and an inorganic microlens processed on top of the PMD layer 560. A thin layer of reflective material, such as a metal, may be blanket deposited over the wafer; the thickness of the reflective material may be on the order of 10-50 nm. The wafer may then be covered with photo-resist. Using standard lithographic techniques, the photo-resist may be patterned to remove the photo-resist from all areas except the curved surface of the inorganic microlens/metal film. The exposed metal may be etched away, either by wet or by dry etching. The remaining photo-resist may be removed, and standard BSI processing may continue.

FIGS. 6A-6G illustrate a process for manufacturing a backside illuminated device with a curved micro-mirror above a pre-metal dielectric layer, according to one embodiment of the invention. FIG. 6(*a*) illustrates a step where the CMOS image sensor (CIS) is processed up to metal 1. FIG. 6(*b*) illustrates a step where an inorganic microlens (i.e. silicon oxide or silicon nitride) is processed on top of the pre-metal dielectric (PMD). FIG. 6(*c*) illustrates a step where a thin layer of reflective material, such as a metal, is blanket deposited over the wafer. The thickness will vary with material, device architecture and processing conditions, however it is expected that this material should be on the order of nanometers (10 nm-50 nm). FIG. 6(*d*) illustrates a step where the wafer is then covered with photo-resist. FIG. 6(*e*) illustrates a step where using standard lithographic techniques, the photo-resist is patterned to remove the resist from all areas except the curved surface of the inorganic microlens/metal film. FIG. 6(*f*) illustrates a step where the exposed metal is etched away, either by wet or dry etching. FIG. 6(*g*) illustrates a step where the remaining photo resist is removed and standard BSI processing continues.

Figure 7:
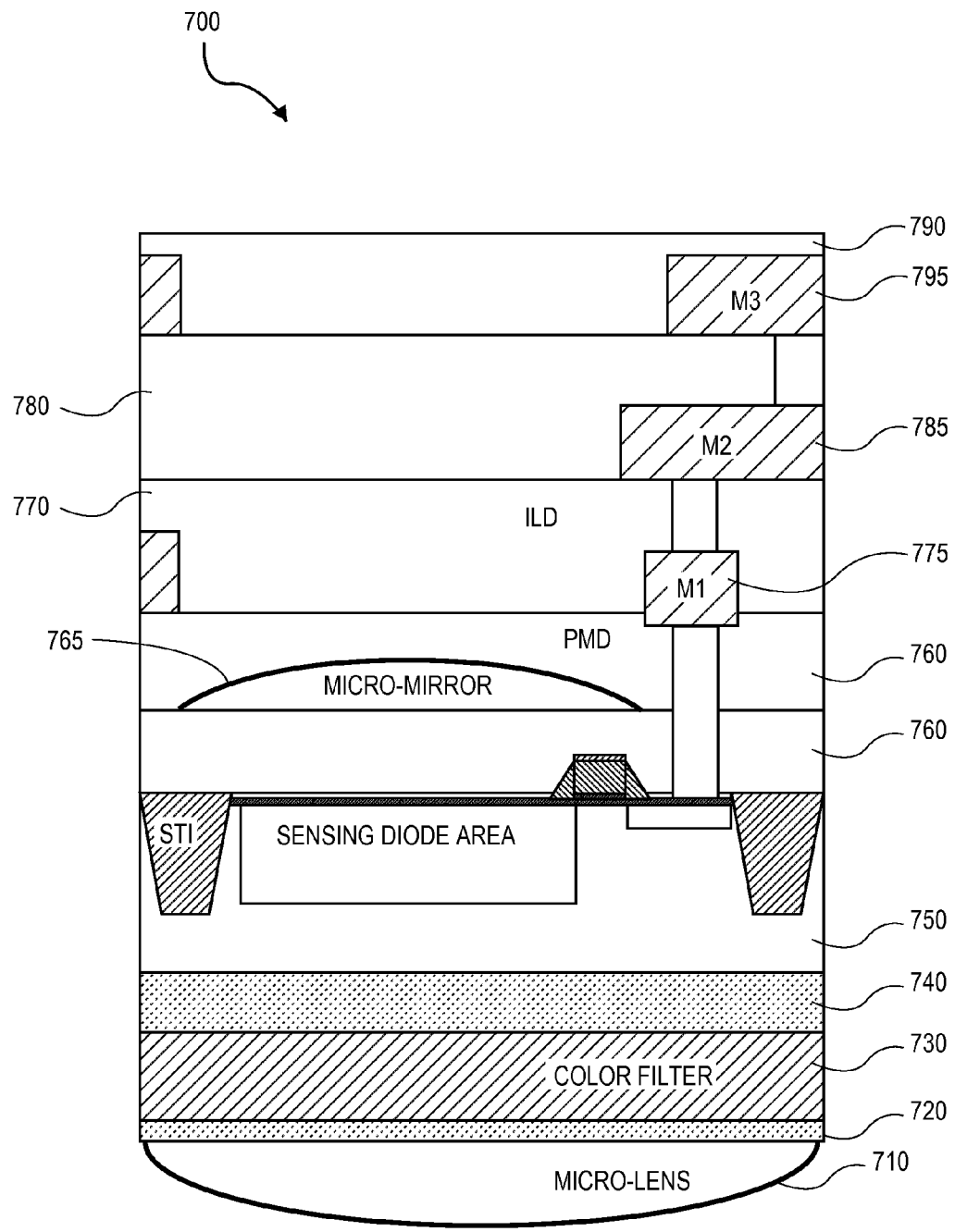
FIG. 7 illustrates a schematic cross-section portion of a backside illuminated device with a micro-mirror fabricated within a pre-metal dielectric layer, according to one embodiment of the invention.
Figure 8B:
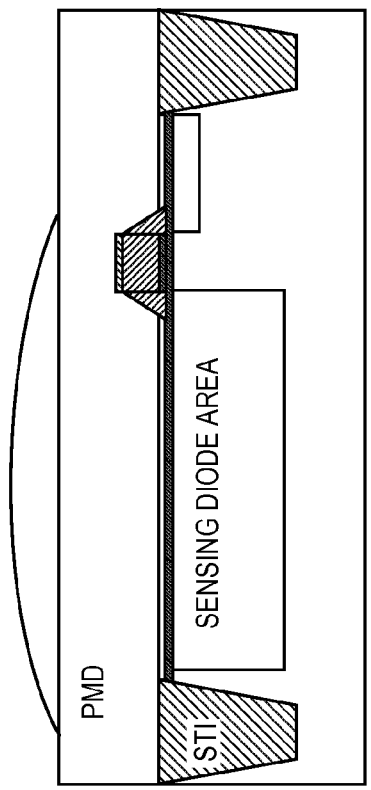
FIGS. 8A-8H illustrate steps for fabricating a backside illuminated device with a micro-mirror fabricated within a pre-metal dielectric layer, according to one embodiment of the invention.
Figure 8A:
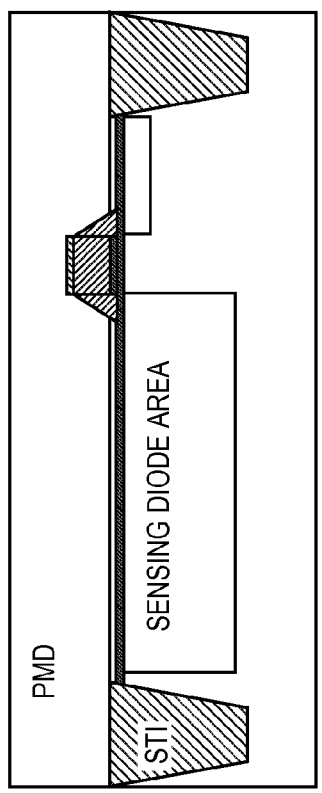
Figure 8D:
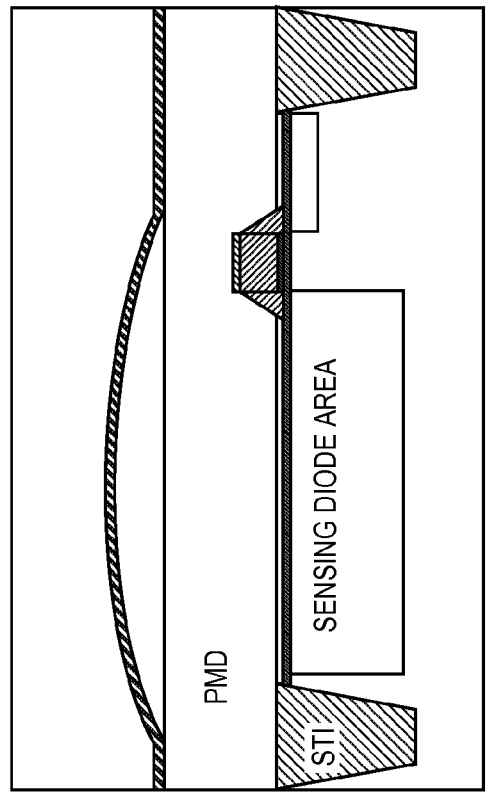
Figure 8C:
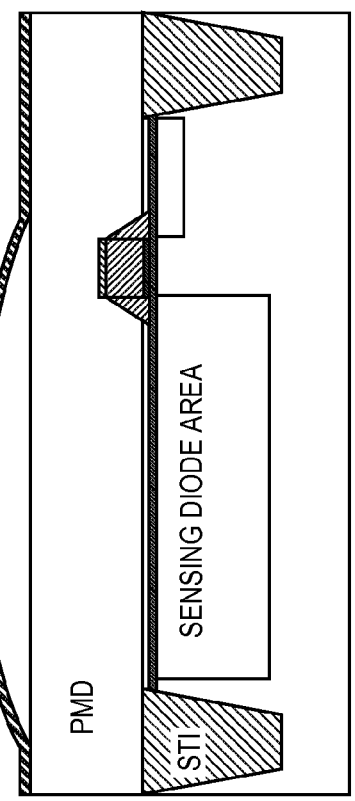
Figure 8F:
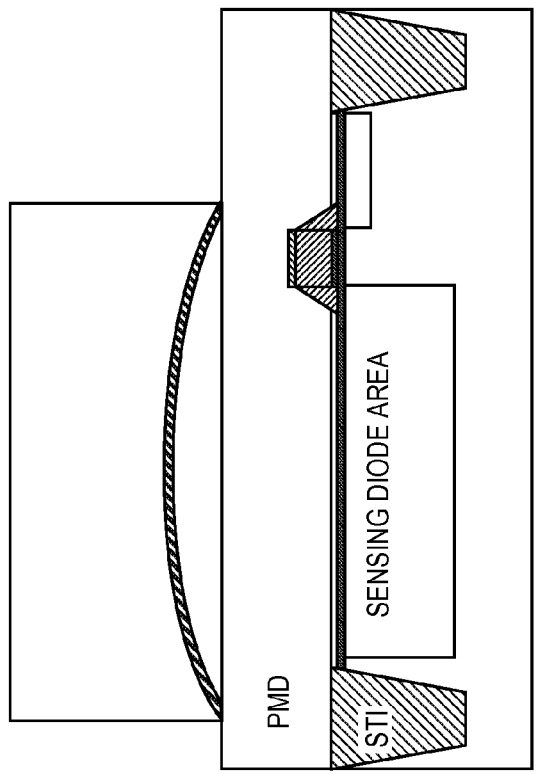
Figure 8E:
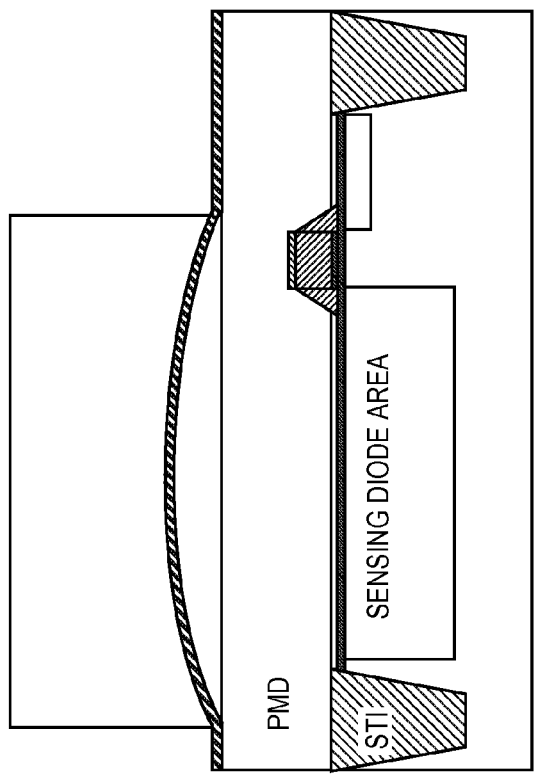
Figure 8G:
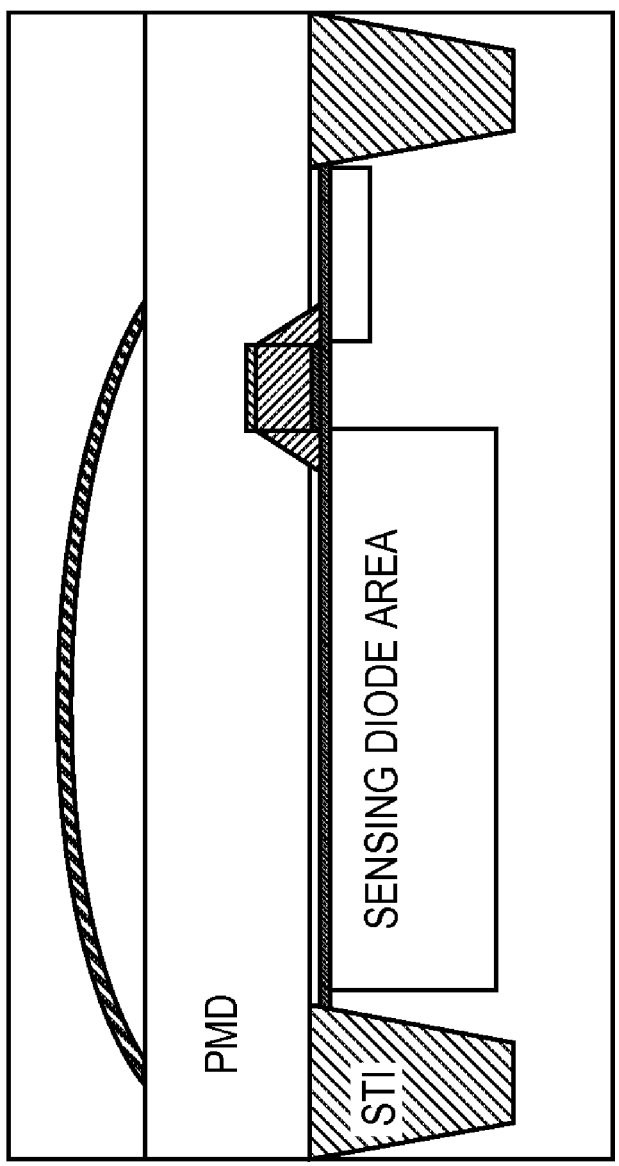
Figure 8H:
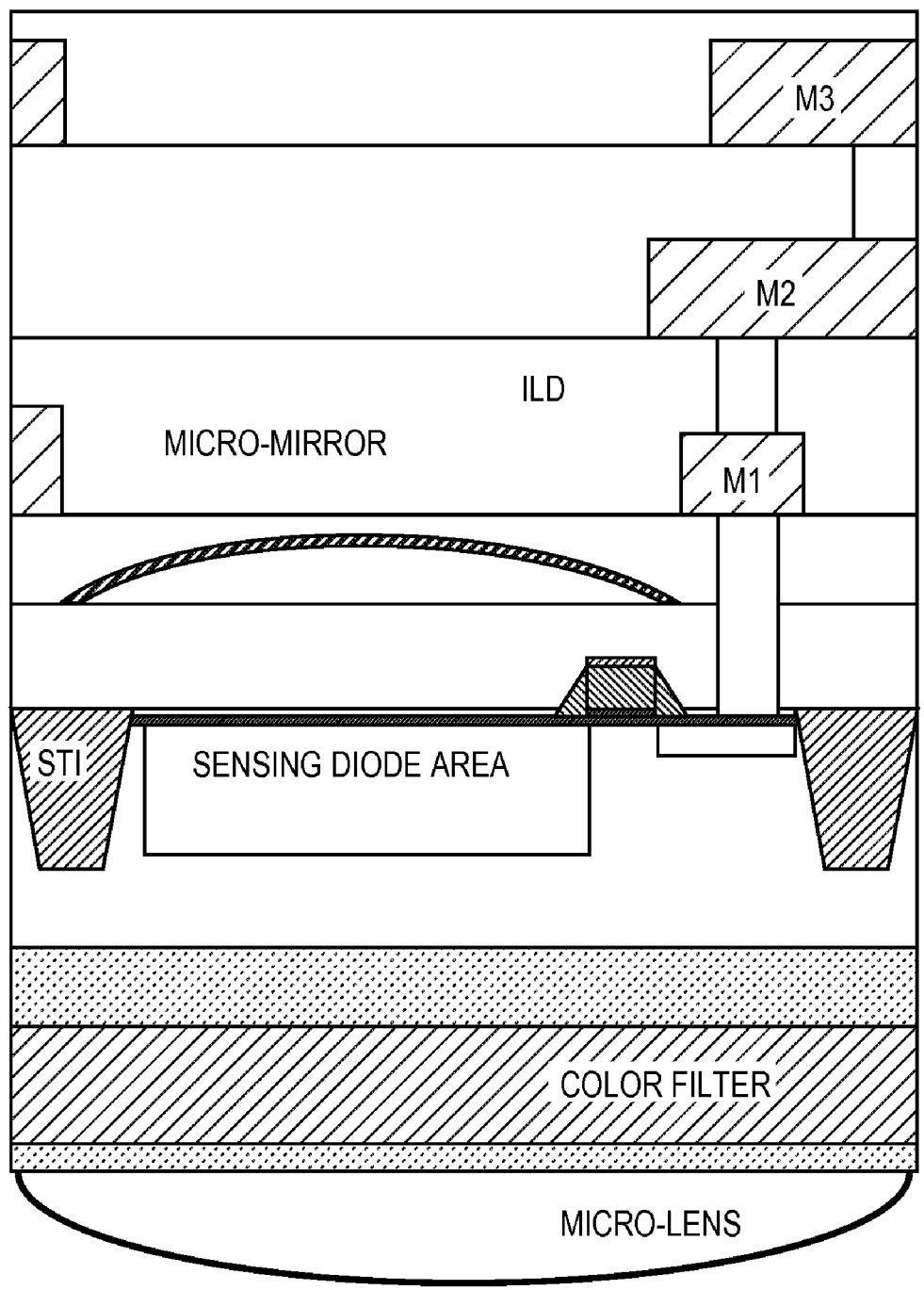

FIG. 7 illustrates a schematic cross-section portion of a backside illuminated device 700 with a curved micro-mirror 765 fabricated within a pre-metal dielectric layer 760. Much of the structure of the embodiment of FIG. 7 is similar to that of FIG. 5. Micro-lens 710 is coupled to planarization layer 720. Planarization layer 720 is coupled to color filter 730. Color filter 730 is coupled to planarization layer 740. Planarization layer 740 is coupled to substrate 750. Substrate 750 is coupled to pre-metal dielectric (PMD) layer 760. Unlike the embodiment of FIG. 5 where the micro-mirror 565 is formed atop of the PMD layer 560, in this embodiment, the PMD layer 760 has integrally formed therein the micro-mirror 765. PMD layer 760 is coupled to inter-layer dielectric (ILD) layer 770 and first metal layer 775. ILD layer 770 is coupled to inter-layer dielectric (ILD) layer 780 and second metal layer 785. ILD layer 780 is coupled to inter-layer dielectric (ILD) layer 790 and third metal layer 795.

In this embodiment, the CIS is processed up to PMD deposition. At this point, a portion of the PMD layer 760 is deposited. An inorganic microlens 710 (e.g. silicon dioxide or silicon nitride) may be processed on top of the first portion of the PMD layer 760. A thin layer of a reflective material, such as a metal, may be blanket deposited over the wafer. The thickness of the reflective material layer may be on the order of 10-50 nm. The wafer may then be covered with photo-resist. Using standard lithographic techniques, the photo-resist may be patterned to remove the photo-resist from all areas except the curved surface of the inorganic microlens/metal film. The exposed metal may be etched away by either wet or dry etching. The remaining photo-resist may be removed and a remainder of the PMD layer 760 may be deposited. The remainder of the PMD layer 760 may need to be planarized, e.g. by CMP. Standard BSI processing may continue from this point. The disadvantage of this technique is that the PMD layer 760 may need to be planarized, which is an extra processing step.

FIGS. 8A-8H illustrate steps for fabricating a backside illuminated device with a micro-mirror fabricated within a pre-metal dielectric layer, according to one embodiment of the invention. FIG. 8(*a*) illustrates a step where the CMOS image sensor (CIS) is processed up to PMD deposition. At this point a portion of the PMD thickens is deposited (PMD/n) FIG. 8(*b*) illustrates a step where an inorganic microlens (i.e. silicon oxide or silicon nitride) is processed on top of the 1.sup.st PMD layer. FIG. 8(*c*) illustrates a step where a thin layer of reflective material, such as a metal, is blanket deposited over the wafer. The thickness will vary with material, device architecture and processing conditions, however it is expected that this material should be on the order of nanometers (10 nm-50 nm). FIG. 8(*d*) illustrates a step where the wafer is then covered with photo-resist. FIG. 8(*e*) illustrates a step where using standard lithographic techniques, the photo-resist is patterned to remove the resist from all areas except the curved surface of the inorganic microlens/metal film. FIG. 8(*f*) illustrates a step where the exposed metal is etched away, either by wet or dry etching. FIG. 8(*g*) illustrates a step where the remaining photo resist is removed and the remainder of the PMD layer is deposited. Depending on the thickness, the second PMD layer may need to be planarized; for instance by CMP. FIG. 8(*h*) illustrates a step where standard BSI processing is continued.

Figure 9:
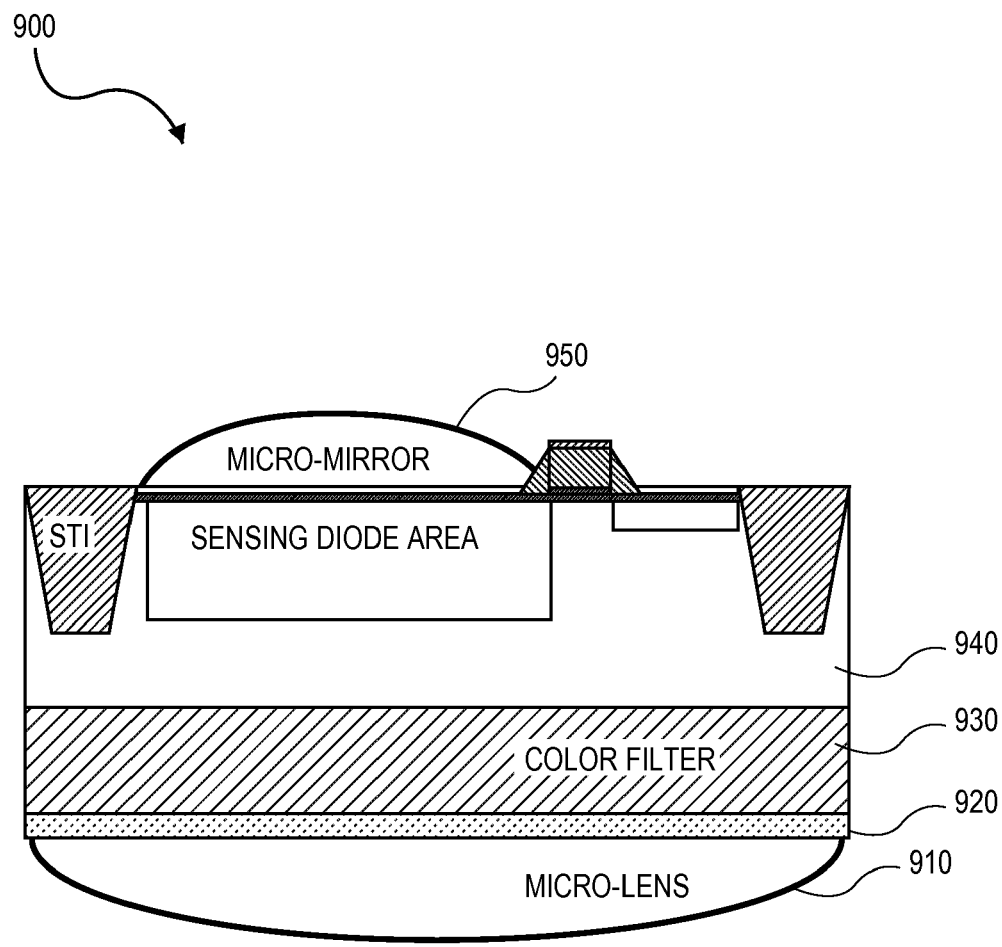
FIG. 9 illustrates a schematic cross-section portion of a backside illuminated device with a micro-mirror fabricated on a silicon surface of the backside illuminated device, according to one embodiment of the invention.
Figure 10A:
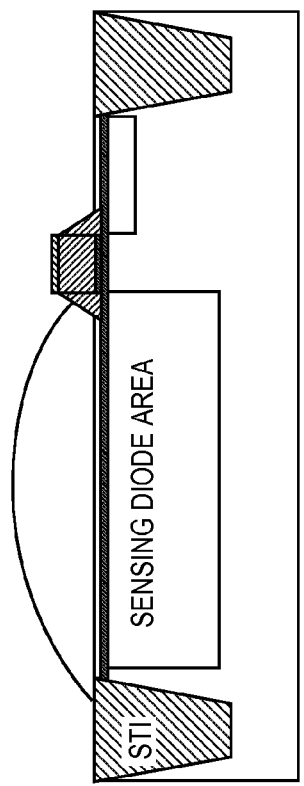
FIGS. 10A-10G illustrate steps for fabricating a backside illuminated device with a micro-mirror fabricated on a silicon surface of the backside illuminated device, according to one embodiment of the invention.
Figure 10B:
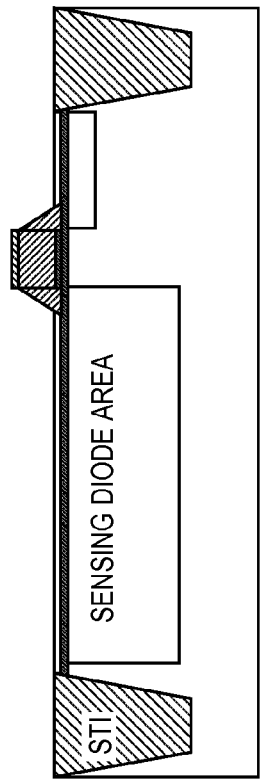
Figure 10D:
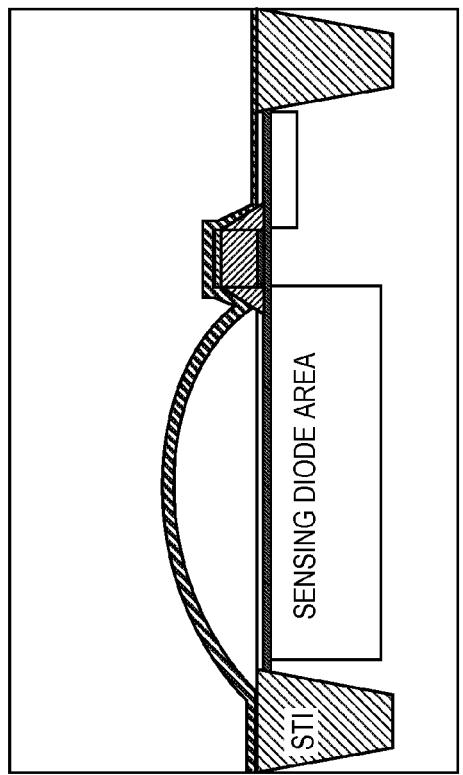
Figure 10C:
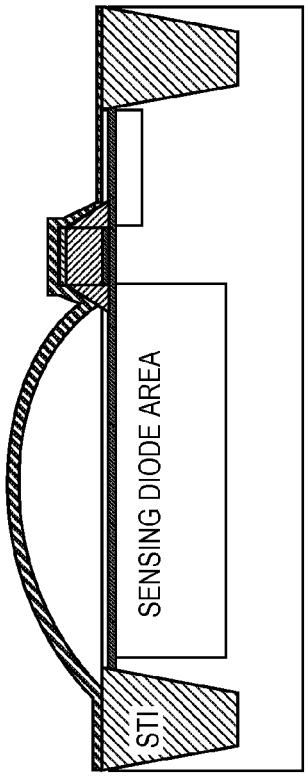
Figure 10F:
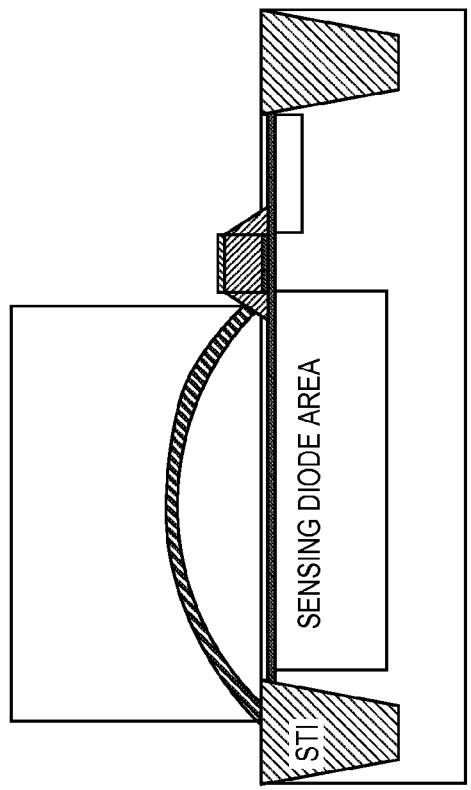
Figure 10E:
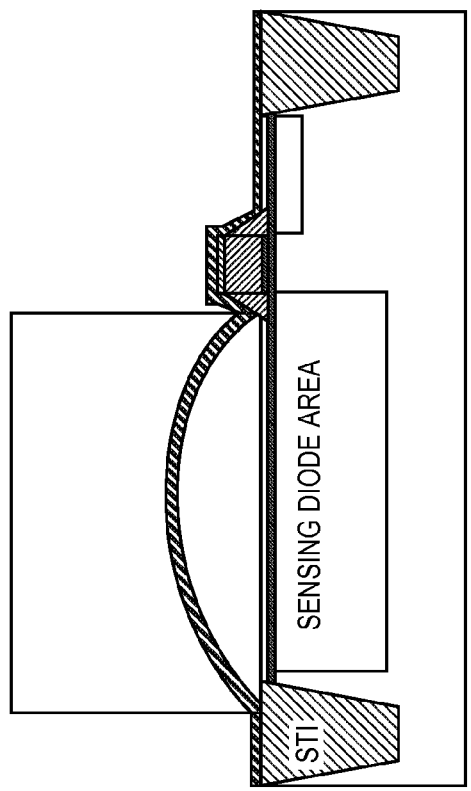
Figure 10G:
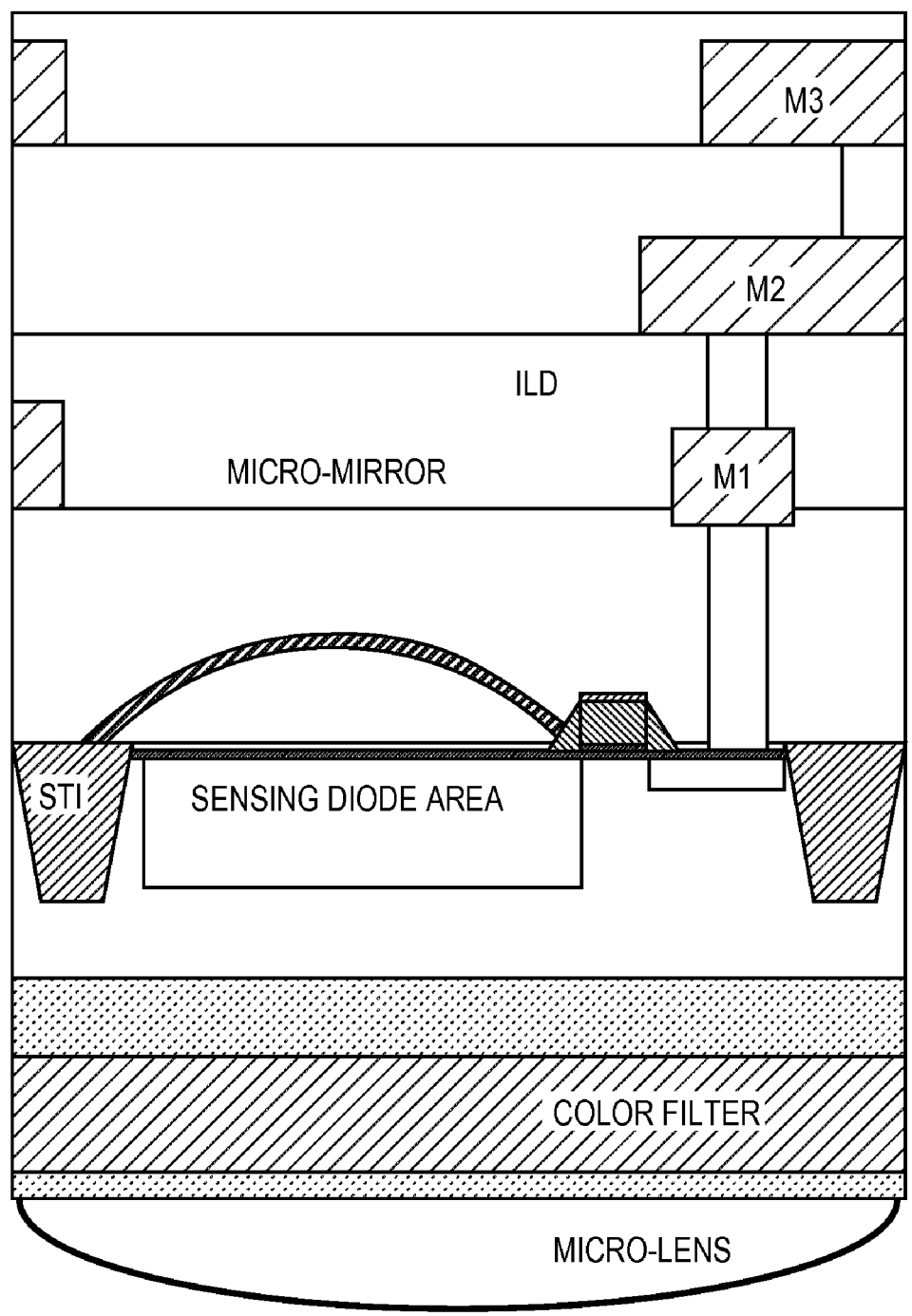

In another embodiment of the present invention, FIG. 9 illustrates a schematic cross-section portion of a backside illuminated device where the micro-mirror is fabricated on the substrate 940 before any pre-metal dielectric layer is formed. Note that the micro-mirror is not in direct contact with the substrate 940 and instead sits atop various other thin layers (e.g. gate oxides, silicides, etc. . . . ) not germane to the present invention. Thus, the term "on the substrate 940" is broad and generally means prior to any thick dielectric layers. In this embodiment, the CIS may be processed up to the PMD deposition step. An inorganic microlens (e.g. silicon oxide or silicon nitride) may be processed on top of the silicon surface. There may be a layer between the microlens and the silicon surface, such as a contact etch stop layer; such a layer is usually made of silicon oxide or silicon nitride. A thin layer of a reflective material, such as a metal, may be blanket deposited over the wafer; this reflective material may be 10-50 nm thick. The wafer may then be covered with photoresist. Using standard lithographic techniques, the photoresist may be patterned to remove the resist from all areas except the curved surface of the inorganic microlens/metal film. The exposed metal may be etched away by wet or dry etching. The remaining photoresist may be removed, and standard BSI processing may continue from this point. Depending on the thickness of the micromirror and the PMD layer, an additional planarization step may be required before standard BSI processing. The advantage of this embodiment is that it reduces the probability that light will scatter into an adjacent device.

FIGS. 10A-10G illustrate steps for fabricating a backside illuminated device with a micro-mirror fabricated on a silicon surface of the backside illuminated device, according to one embodiment of the invention. FIG. 10(*a*) illustrates a step where the CMOS image sensor (CIS) is processed up to PMD deposition. FIG. 10(*b*) illustrates a step where an inorganic microlens (i.e. silicon oxide or silicon nitride) is processed on top of the silicon surface. There may be a layer between the microlens and the silicon surface such as a contact etch stop layer; usually made of silicon oxide or silicon nitride. FIG. 10(*c*) illustrates a step where thin layer of reflective material, such as a metal, is blanket deposited over the wafer. The thickness will vary with material, device architecture and processing conditions, however it is expected that this material should be on the order of nanometers (10 nm-50 nm). FIG. 10(*d*) illustrates a step where the wafer is covered with photo-resist. FIG. 10(*e*) illustrates a step where using standard lithographic techniques, the photo-resist is patterned to remove the resist from all areas except the curved surface of the inorganic microlens/metal film. FIG. 10(*f*) illustrates a step where the exposed metal is etched away, either by wet or dry etching. FIG. 10(*g*) illustrates a step where the remaining photo resist is removed standard BSI processing continues from this point. In this case the next step would most likely be PMD deposition. Depending on the thickness of the newly formed micro mirror and the PMD layer, an additional planarization step may be required.

Figure 11:
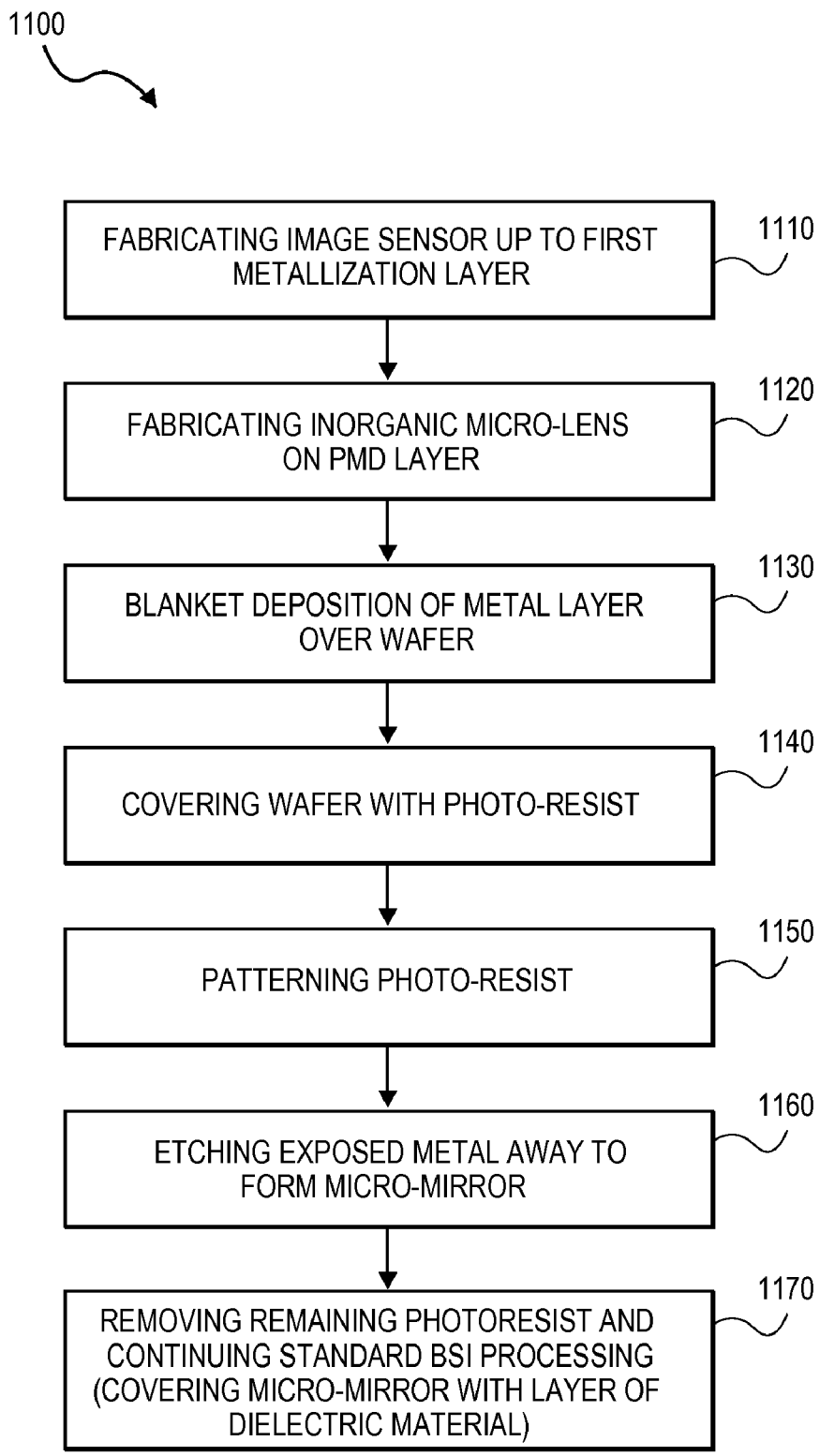
FIG. 11 shows a flow chart for a method of fabricating a micro-mirror according to one embodiment of the invention.

FIG. 11 shows a flow chart 1100 for a method of fabricating a micro-mirror according to one embodiment of the invention. In step 1110, an image sensor is fabricated up to, but not including, a first metallization layer. In step 1120, an inorganic microlens (i.e. silicon oxide or silicon nitride) is processed on top of a pre-metal dielectric (PMD) layer. In step 1130, a thin layer of reflective material, such as a metal, is blanket deposited over the wafer. The thickness will vary with material, device architecture and processing conditions, however it is expected that this material should be on the order of nanometers (10 nm-50 nm).

In step 1140, the wafer is then covered with photo-resist. In step 1150, the photo-resist is patterned to remove the resist from all areas except the curved surface of the inorganic microlens/metal film. In step 1160, exposed metal is etched away, either by wet or dry etching. In step 1170, the remaining photo resist is removed and standard BSI processing continues.

Figure 12:
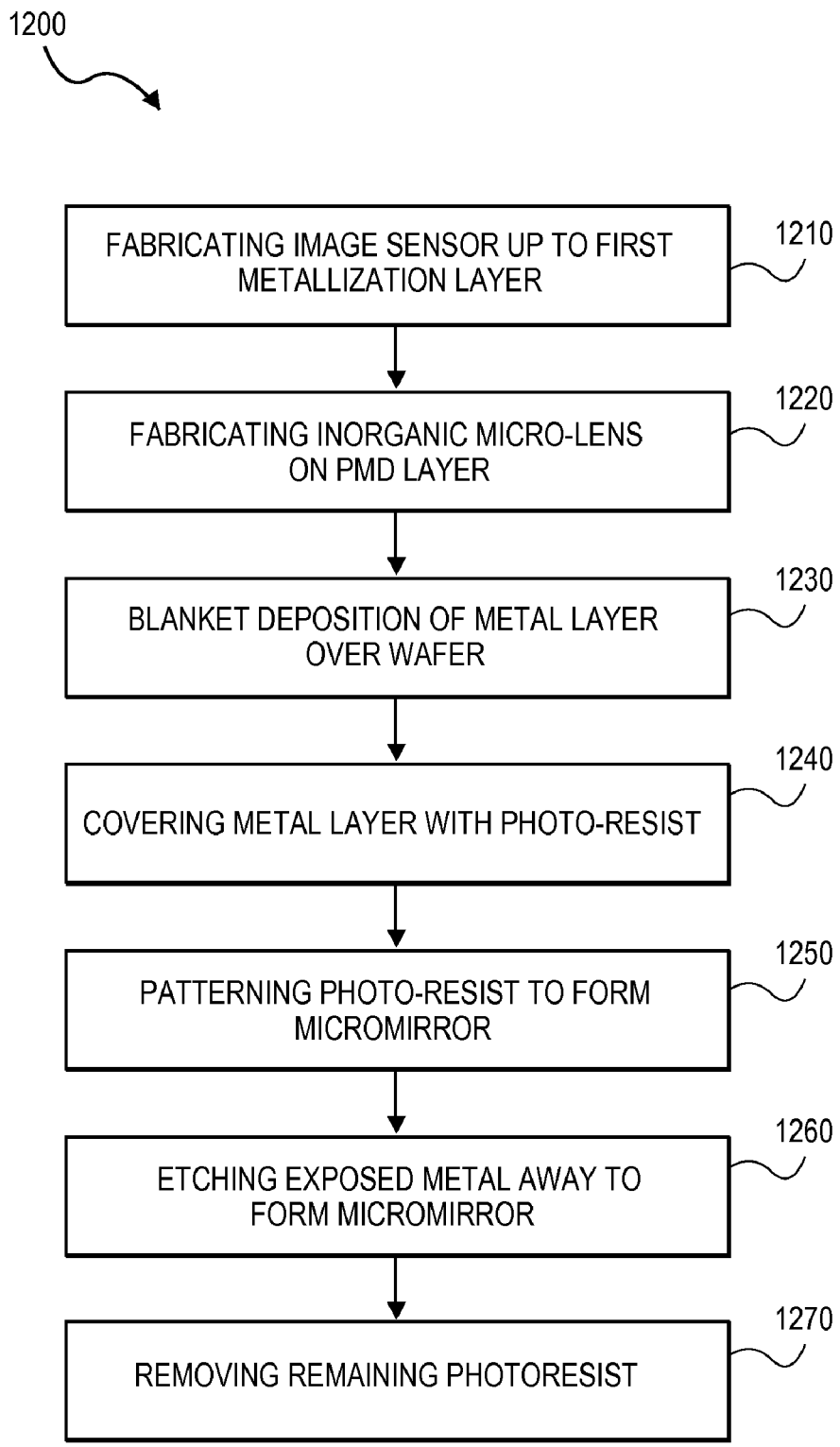
FIG. 12 shows a flow chart for a method of fabricating a micro-mirror according to one embodiment of the invention.

FIG. 12 shows a flow chart 1200 for a method of fabricating a micro-mirror according to one embodiment of the invention. In step 1210, an image sensor is fabricated up to, but not including, a first metallization layer. In step 1220, an inorganic micro-lens is (i.e. silicon oxide or silicon nitride) is processed on top of a pre-metal dielectric (PMD) layer of the image sensor. In step 1230, a thin layer of reflective material, such as a metal, is blanket deposited over the wafer. The thickness will vary with material, device architecture and processing conditions, however it is expected that this material should be on the order of nanometers (10 nm-50 nm). In step 1240, the wafer is then covered with photo-resist. In step 1250, the photo-resist is patterned to remove the resist from all areas except the curved surface of the inorganic microlens/metal film. In step 1260, exposed metal is etched away, either by wet or dry etching. In step 1270, remaining photo resist is removed and standard BSI processing continues.

Figure 13:
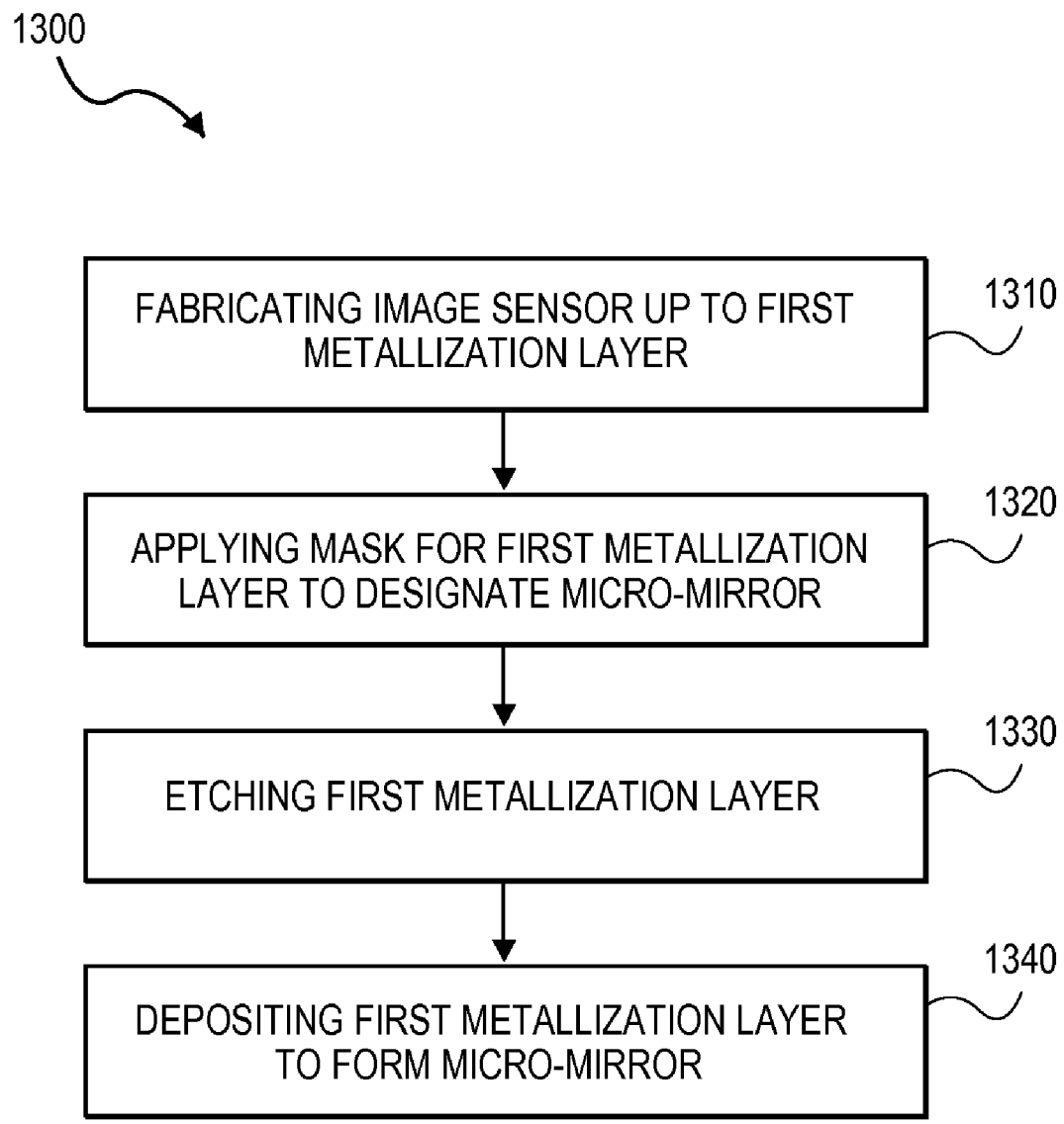
FIG. 13 shows a flow chart for a method of fabricating a micro-mirror according to one embodiment of the invention.

FIG. 13 shows a flow chart 1300 for a method of fabricating a micro-mirror according to an alternative embodiment of the invention. In step 1310, an image sensor is fabricated up to, but not including, a first metallization layer. In step 1320, a mask for a first metallization layer is applied. The mask designates a micro-mirror. In step 1330, a first metallization layer is etched. In step 1340, a first metallization layer is deposited to form a micro-mirror.

Figure 14:
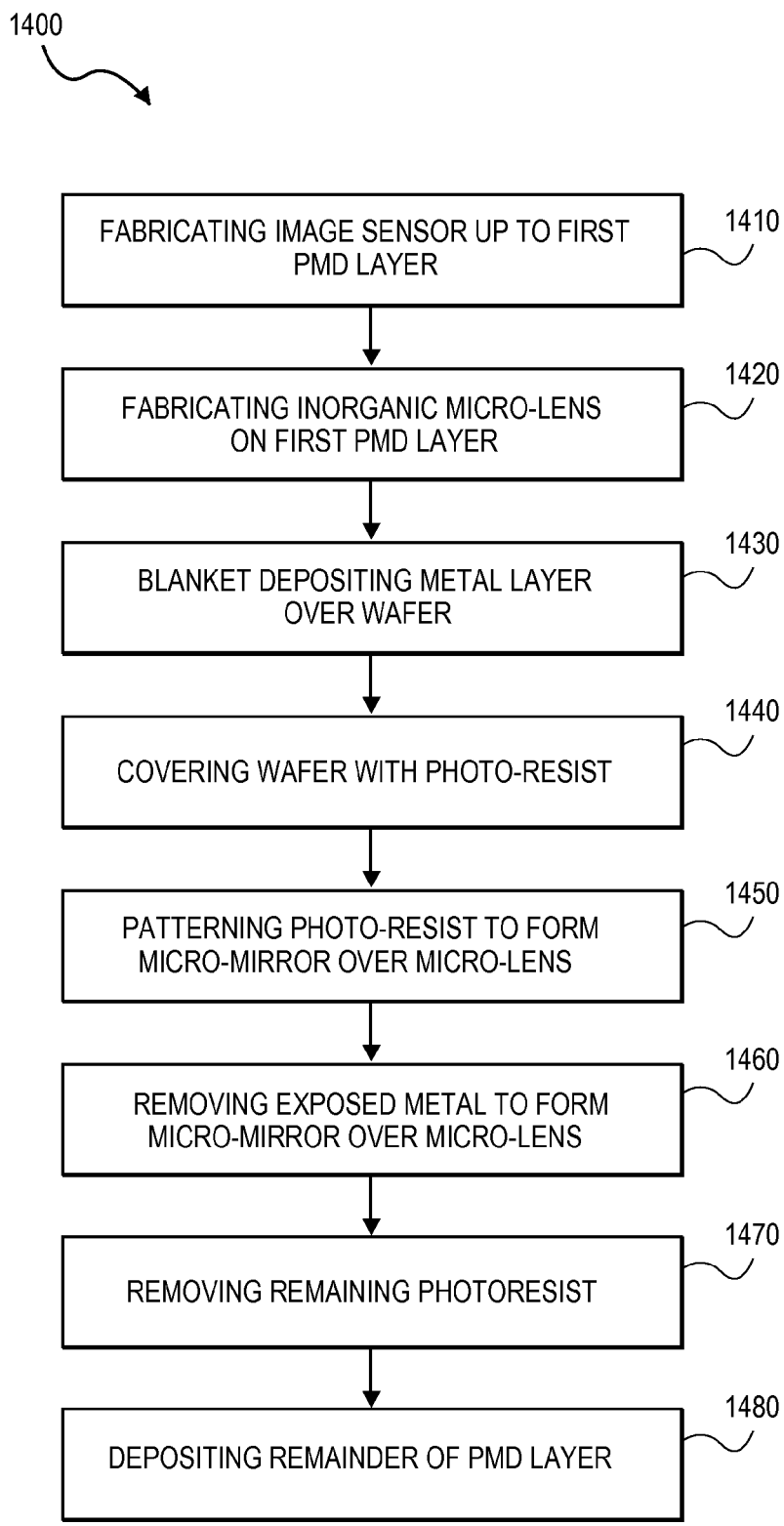
FIG. 14 shows a flow chart for a method of fabricating a micro-mirror according to one embodiment of the invention.

FIG. 14 shows a flow chart 1400 for a method of fabricating a micro-mirror according to an alternative embodiment of the invention. In step 1410, an image sensor is fabricated up to PMD deposition. At this point a portion of the PMD thickness is deposited (PMD/n). In step 1420, an inorganic microlens (i.e. silicon oxide or silicon nitride) is processed on top of the 1$^{st}$ PMD layer. In step 1430, thin layer of reflective material, such as a metal, is blanket deposited over the wafer. The thickness will vary with material, device architecture and processing conditions, however it is expected that this material should be on the order of nanometers (10 mm-50 nm).

In step 1440, the wafer is then covered with photo-resist. In step 1450, Using standard lithographic techniques, the photoresist is patterned to remove the resist from all areas except the curved surface of the inorganic microlens/metal film. In step 1460, the exposed metal is etched away, either by wet or dry etching. In step 1470, remaining photo resist is removed. In step 1480, the remainder of the PMD layer is deposited. Depending on the thickness, the second PMD layer may need to be planarized; for instance by CMP.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

The invention claimed is:

1. An image sensor comprising:
   a light sensitive element configured to receive light from a light-incident side of the image sensor;
   a pre-metal dielectric layer;
   a micro-mirror coupled to the pre-metal dielectric layer such that the light sensitive element is between the light incident side of the image sensor and the micro-mirror, wherein the micro-mirror includes:
      a micro-lens coupled to the pre-metal dielectric layer; and
      a metal layer coupled to the micro-lens; and
   a layer of dielectric material covering the micro-mirror.

2. The image sensor as in claim 1, wherein the micro-mirror is curved and disposed above the pre-metal dielectric layer.

3. The image sensor of claim 1, wherein the micro-mirror is disposed to redirect incident light back through to the light sensitive element.

4. The image sensor of claim 1, wherein the light sensitive element includes a photodiode.

5. The image sensor of claim 1, wherein the micro-lens is a first micro-lens and wherein the image sensor further includes a second micro-lens disposed on the light-incident side of the image sensor, such that the light sensitive element is disposed between the first micro-lens and the second micro-lens.

6. A backside illuminated image sensor comprising:
   a light sensitive element configured to receive light from a backside of the image sensor;
   a pre-metal dielectric layer;
   a micro-mirror coupled to the pre-metal dielectric layer such that the light sensitive element is between the backside of the image sensor and the micro-mirror, wherein the micro-mirror includes:
      a micro-lens coupled to the pre-metal dielectric layer; and
      a metal layer coupled to the micro-lens; and
   a layer of dielectric material covering the micro-mirror.

7. The image sensor as in claim 6, wherein the micro-mirror is curved and disposed above the pre-metal dielectric layer.

8. The image sensor of claim 6, wherein the micro-mirror is disposed to redirect incident light back through to the light sensitive element.

9. The image sensor of claim 6, wherein the light sensitive element includes a photodiode.

10. The image sensor of claim 6, wherein the micro-lens is a first micro-lens and wherein the image sensor further includes a second micro-lens disposed on the backside of the image sensor, such that the light sensitive element is disposed between the first micro-lens and the second micro-lens.

* * * * *